United States Patent
Melvin, III et al.

(10) Patent No.: US 7,308,673 B2
(45) Date of Patent: Dec. 11, 2007

(54) METHOD AND APPARATUS FOR CORRECTING 3D MASK EFFECTS

(75) Inventors: Lawrence S. Melvin, III, Hillsboro, OR (US); Qiliang Yan, Hillsboro, OR (US); James P. Shiely, Aloha, OR (US)

(73) Assignee: Synopsys, Inc., Mountain View, CA (US)

( * ) Notice: Subject to any disclaimer, the term of this patent is extended or adjusted under 35 U.S.C. 154(b) by 412 days.

(21) Appl. No.: 11/033,415

(22) Filed: Jan. 10, 2005

(65) Prior Publication Data

US 2006/0156270 A1   Jul. 13, 2006

(51) Int. Cl.
G06F 17/50 (2006.01)
G03F 1/00 (2006.01)

(52) U.S. Cl. ............... 716/21; 716/19; 430/5

(58) Field of Classification Search .......... 716/19, 716/21; 430/5
See application file for complete search history.

(56) References Cited

U.S. PATENT DOCUMENTS

| | | | |
|---|---|---|---|
| 6,127,071 A * | 10/2000 | Lu | 430/5 |
| 6,303,253 B1 * | 10/2001 | Lu | 430/5 |
| 6,670,082 B2 * | 12/2003 | Liu et al. | 430/5 |
| 6,785,879 B2 * | 8/2004 | Pierrat | 716/21 |
| 6,794,096 B2 * | 9/2004 | Kroyan | 430/5 |
| 6,830,854 B2 * | 12/2004 | Liu et al. | 430/5 |
| 6,993,741 B2 * | 1/2006 | Liebmann et al. | 716/19 |
| 7,005,218 B2 * | 2/2006 | Zhang | 430/5 |
| 7,194,163 B2 * | 3/2007 | Stepanov | 385/37 |
| 2005/0219502 A1 * | 10/2005 | Sandstrom et al. | 355/77 |

* cited by examiner

Primary Examiner—Paul Dinh
Assistant Examiner—Helen Rossoshek
(74) Attorney, Agent, or Firm—Park, Vaughan & Fleming LLP

(57) ABSTRACT

One embodiment of the present invention provides a system that improves lithography performance by correcting for 3D mask effects. During operation the system receives a mask layout that contains etched regions, called shifters, which can have a phase shift relative to other regions. Next, the system chooses a shifter in the mask layout. The system then corrects for 3D mask effects by, iteratively, (a) selecting a region within the shifter, (b) adjusting the phase shift of the selected region in a simulation model to account for 3D mask effects, and (c) modifying the shape of the shifter based on the difference between a desired pattern and a simulated pattern generated using the simulation model.

21 Claims, 5 Drawing Sheets

METHOD AND APPARATUS FOR CORRECTING 3D MASK EFFECTS

BACKGROUND

1. Field of the Invention

The invention relates to the process of designing and fabricating semiconductor chips. More specifically, the invention relates to a method and an apparatus for improving lithography performance by correcting for three dimensional (3D) mask effects.

2. Related Art

The relentless miniaturization of integrated circuits has been a key driving force behind technological innovations. This miniaturization has been made possible by rapid improvements in various fabrication technologies.

Unfortunately, as integration densities of semiconductor chips continue to increase at an exponential rate, it is becoming progressively harder to deal with various 3D mask effects that arise during lithography.

In particular, phase shift masks (PSMs) suffer from a 3D mask effect called "phase imbalance". Note that a PSM contains phase shifters, which enable the fabrication process to achieve line widths that are smaller than the wavelength of the light used to expose the photoresist layer through the mask. Phase imbalance can be caused by the imperfect 3D structure of a shifter and the diffraction of light by the edge of the shifter. This can result in unwanted distortions in the printed pattern that, in turn, can result in low fabrication yields and large performance variations.

Hence, what is needed is a method and an apparatus for correcting for 3D mask effects.

SUMMARY

One embodiment of the present invention provides a system that improves lithography performance by correcting for 3D mask effects. During operation the system receives a mask layout that contains etched regions, called shifters, which can have a phase shift relative to other regions. Next, the system chooses a shifter in the mask layout. The system then corrects for 3D mask effects by, iteratively, (a) selecting a region within the shifter, (b) adjusting the phase shift of the selected region in a simulation model to account for 3D mask effects, and (c) modifying the shape of the shifter based on the difference between a desired pattern and a simulated pattern generated using the simulation model.

In a variation on this embodiment, the system corrects the phase imbalance during an Optical Proximity Correction (OPC) process. (Note that the term "optical proximity correction" as used herein refers to correction for any specified proximity effects, e.g. optical, micro-loading, etch, resist, etc.)

In a variation on this embodiment, the PSM is an alternating PSM. In another variation on this embodiment, the PSM is an alternating aperture PSM.

In a variation on this embodiment, the phase shift of a shifter can be 0°, 90°, 180°, 270°, or any other combination of phase shifts that offsets the phase shifts of adjacent shifters by 180.

In a variation on this embodiment, the system selects the region within the shifter by selecting a region along the border of the shifter.

In a variation on this embodiment, the system modifies the shape of the shifter by adding hammerheads or serifs to the shifter.

In a variation on this embodiment, the system adjusts the phase shift of the selected region in the simulation model by assigning a phase shift to the selected region which is less than a desired phase shift value.

DETAILED DESCRIPTION

Integrated Circuit Design And Fabrication

Figure 1:
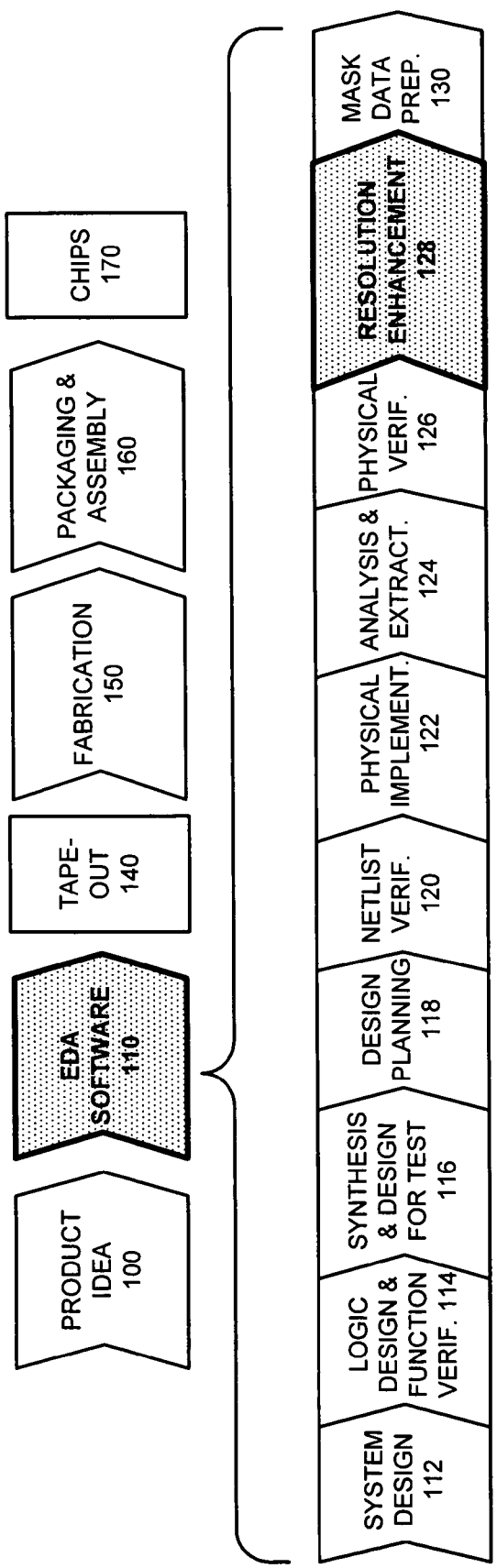
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention. The process starts with a product idea (step 100). Next, the product idea is realized using an integrated circuit, which is designed using Electronic Design Automation (EDA) software (step 110). Once the circuit design is finalized, it is taped-out (step 140). After tape-out, the process goes through fabrication (step 150), packaging, and assembly (step 160). The process eventually culminates with the production of chips (step 170).

The EDA software design step 110, in turn, includes a number of sub-steps, namely, system design (step 112), logic design and function verification (step 114), synthesis and design for test (step 116), design planning (step 118), netlist verification (step 120), physical implementation (step 122), analysis and extraction (step 124), physical verification (step 126), resolution enhancement (step 128), and mask data preparation (step 130).

Note that, PSM phase imbalance correction can take place during the resolution enhancement step 128. Specifically, PSM phase imbalance correction can be implemented in the Proteus® product from Synopsys, Inc.

3D Mask Effects

The relentless miniaturization of integrated circuits has been a key driving force behind technological innovations. This miniaturization has been made possible by rapid improvements in various fabrication technologies.

Unfortunately, as integration densities of semiconductor chips continue to increase at an exponential rate, it is becoming progressively harder to deal with various three dimensional (3D) mask effects that arise during lithography.

For example, phase shift masks (PSMs) suffer from a 3D mask effect called "phase imbalance". For the sake of clarity, we have described the present invention in the context of a PSM. But, it will be apparent to one skilled in the art that the present invention can be used to correct any kind of 3D mask effect. For example, the present invention can be used to correct 3D mask effects in extreme ultraviolet (EUV) lithography, which uses radiation with a wavelength in the range of 10 to 14 nanometers (nm) to carry out projection imaging.

PSMs are a powerful resolution enhancement technique which can substantially increase the resolution of a conventional optical lithography system. Note that there are different types of PSMs, such as, alternating PSMs (altPSMs), alternating aperture PSMs (AAPSMs), etc. For the sake of clarity, we have described the present invention in the context of an alternating PSM, but it will be apparent to one skilled in the art that the present invention can be easily applied to other types of PSMs. In the remainder of the instant application, unless otherwise stated, the term "PSM" will refer to an alternating PSM.

A PSM contains phase shifters that enable the fabrication process to achieve line widths that are smaller than the wavelength of the light used to expose the photoresist layer through the mask.

Figure 2:
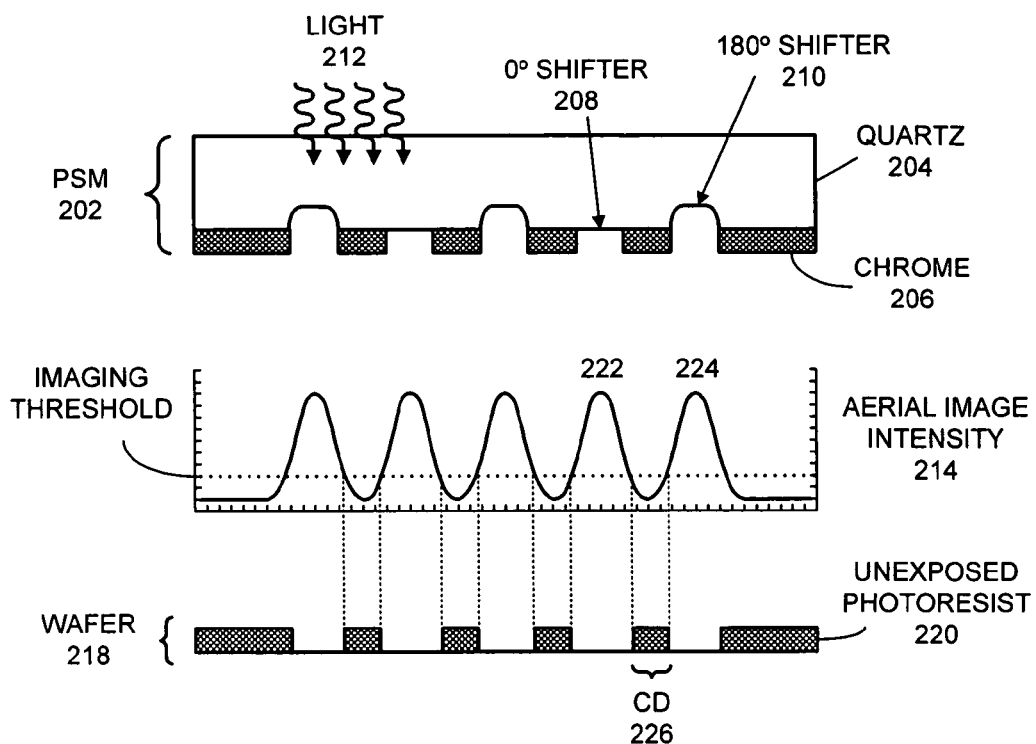
FIG. 2 illustrates how a PSM can be used to produce features on a wafer in accordance with an embodiment of the present invention.

FIG. 2 illustrates how a PSM can be used to produce features on a wafer in accordance with an embodiment of the present invention. (Note that the drawings in FIG. 2 are for illustration purposes only, and do not depict an actual lithography process.)

In one embodiment of the present invention, PSM 202 comprises a clear medium, such as quartz plate 204, with deposits of an opaque substance, such as chrome 206. Moreover, adjacent clear areas, called "shifters", on PSM 202 have different phase shifts. For example, in one embodiment of the present invention, shifter 208 has a phase shift of 0°, while adjacent shifter 210 has a phase shift of 180°. It will be apparent to one skilled in the art that a number of different phase shifts can be used in a PSM. For example, in another embodiment of the present invention, adjacent shifters have phase shifts of 90° and 270°.

During operation, light 212 is passed through the PSM 202 to create an aerial image on the wafer 218. Plot 214 illustrates the variation of the aerial image intensity on the wafer's surface. Note that the aerial image intensity 214 contains a number of destructive interference nodes that are caused by two adjacent shifters, such as shifters 208 and 210, on PSM 202. These destructive interference nodes are used to create unexposed areas on the resist layer on the wafer 218. After the resist layer is etched away, these unexposed areas, such as unexposed resist 220, form the desired pattern on the wafer's surface.

Phase Imbalance In PSMs

A PSM works by exploiting the fact that light passing through a mask's clear regions exhibits a wave characteristic having a phase that is a function of the distance the light travels through the mask material. By placing two shifters adjacent to each other on the mask, one of thickness $t_1$ and the other of thickness $t_2$, one can obtain a desired unexposed area on the underlying photoresist layer caused by interference. For example, in one embodiment of the present invention, the thickness $t_1$ of shifter 208 and thickness $t_2$ of shifter 210 are varied so that the light exiting the material of thickness $t_2$ can be made to be 180° out of phase with the light exiting the material of thickness $t_1$, thereby creating a destructive interference node.

Unfortunately, the process of etching a shifter can involve complex physical, transport, and chemical interactions in an etch chamber. Consequently, the 3D structure of a shifter can have imperfections. Ideally, we want the sidewalls of shifter 210 to be straight. But, since these etch processes are usually not anisotropic, the sidewalls of shifter 210 can be sloped or curved as shown. Moreover, these imperfect sidewalls can influence the propagation of light which can also lead to undesirable optical effects. (Note that, even if the sidewalls are perfectly vertical, they may still have 3D effects because of the wave characteristics of light.)

These imperfections in the shifter's 3D structure can cause a phase imbalance. Specifically, these imperfections can cause the image intensity 224 under 180° shifter 210 to be less than the image intensity 222 under 0° shifter 208. This, in turn, can cause errors in the location and/or the critical dimension (CD) 226 of features on the wafer, which can result in low fabrication yields and large performance variations. The phase imbalance can also arise from diffraction off shifter (or other 3D feature) side walls. Note that phase imbalance can occur even when the phase shifts of adjacent shifters are not 0° and 180°. For example, a PSM with 90° and 270° shifters can also have phase imbalance. One embodiment of the present invention can correct for phase imbalance of a PSM, regardless of the cause for the phase imbalance.

Figure 3:
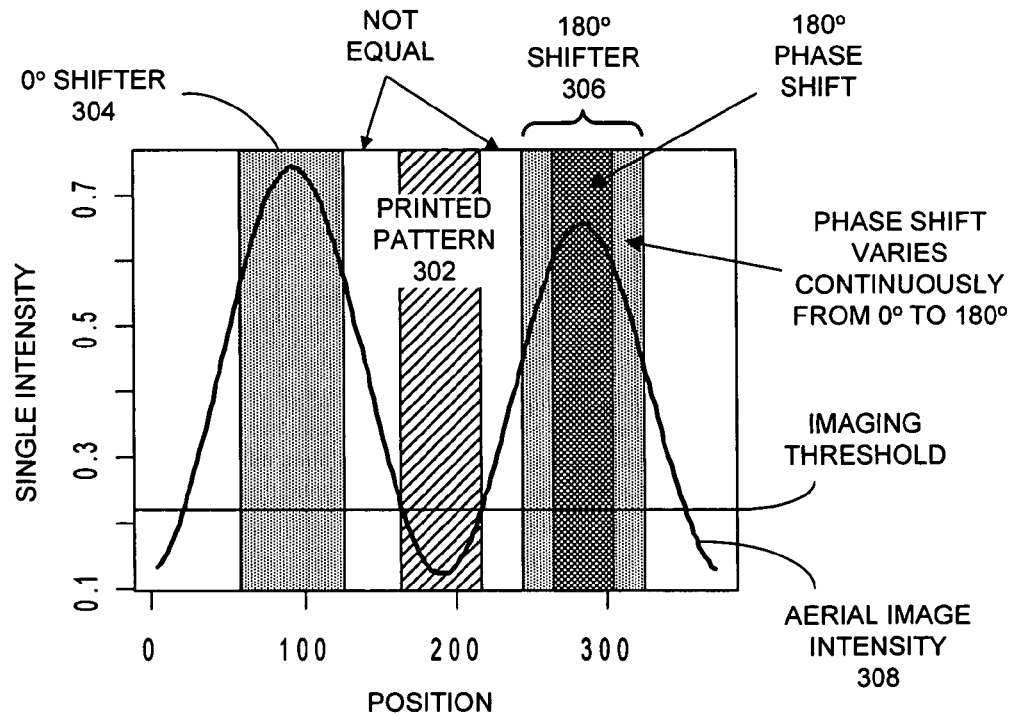
FIG. 3 illustrates how phase imbalance can cause errors in the location of a feature on the wafer in accordance with an embodiment of the present invention.

FIG. 3 illustrates how phase imbalance can cause errors in the location of a feature on the wafer in accordance with an embodiment of the present invention.

Printed pattern 302 is generated by the destructive interference between the light passing through 0° shifter 304 and 180° shifter 306. Imperfections in the 3D structure of 180° shifter 306 can cause the phase shift to vary continuously from 0° at the edge of shifter 306 to 180° at the center of shifter 306. This, in turn, can cause an asymmetry in the aerial image intensity 308. For example, the image intensity under 180° shifter 306 can be less than the image intensity under 0° shifter 304. Due to this asymmetry, printed pattern 302 may not locate exactly in the middle of shifters 304 and 306. Moreover, the CD of printed pattern 302 may not be accurate (e.g., it may be greater than the desired CD).

Process of Correcting 3D Mask Effects

Figure 4A:
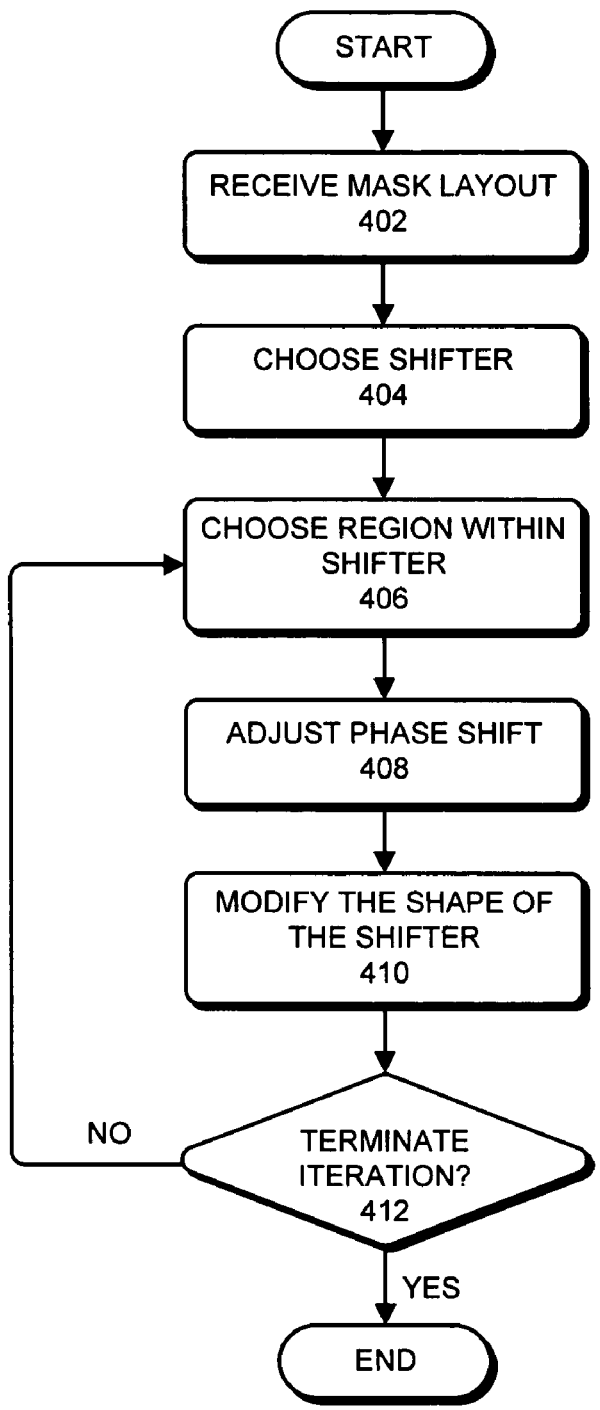
FIG. 4A presents a flowchart that illustrates the process of correcting for 3D mask effects (e.g., phase imbalance) in accordance with an embodiment of the present invention.
Figure 4B:
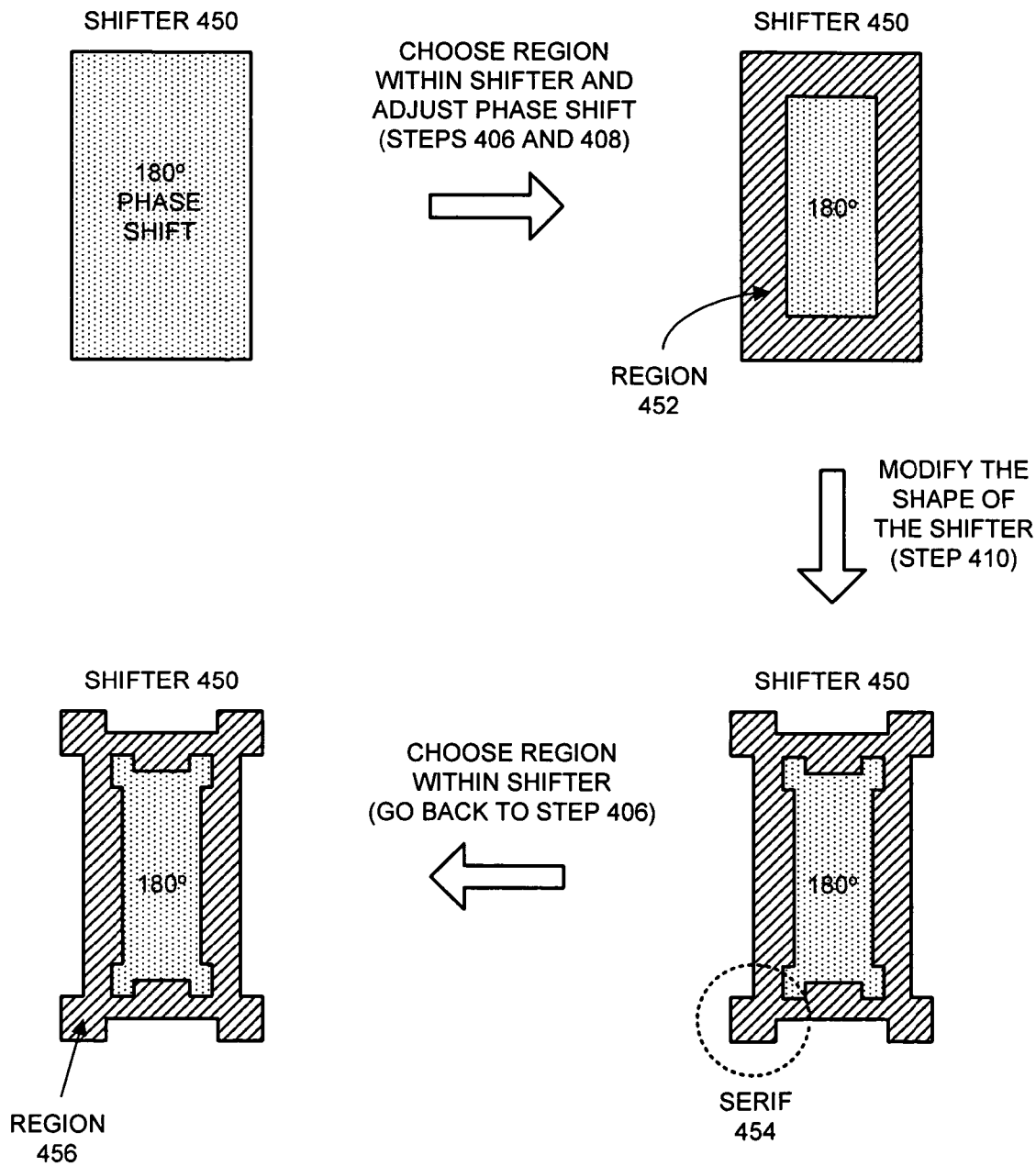
FIGS. 4B and 4C illustrate the process of correcting for 3D mask effects (e.g., phase imbalance) in accordance with an embodiment of the present invention.
Figure 4C:
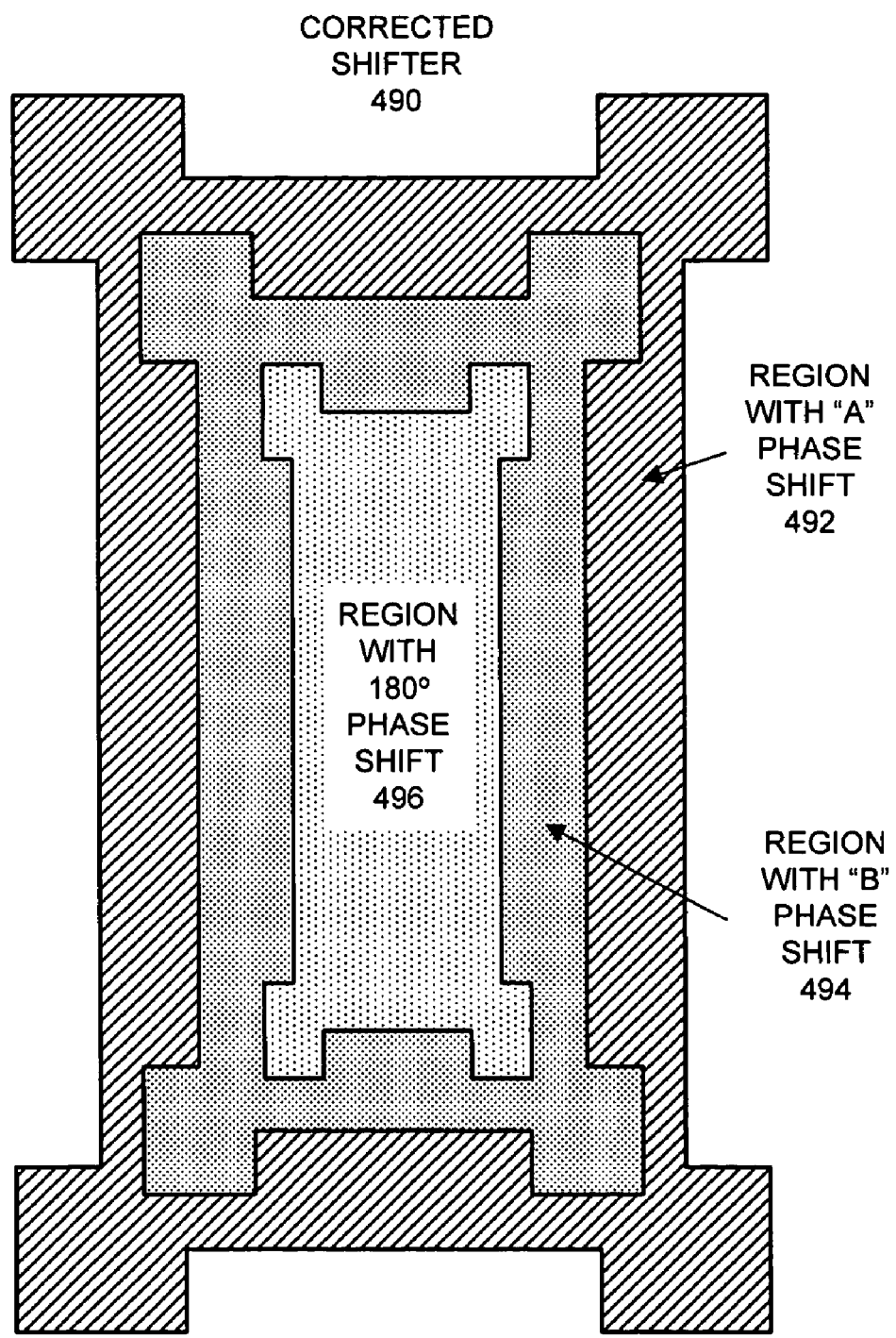

FIG. 4A presents a flowchart that illustrates the process of correcting for 3D mask effects (e.g., phase imbalance) in accordance with an embodiment of the present invention. FIGS. 4B and 4C illustrate the process of correcting for 3D mask effects (e.g., phase imbalance) in accordance with an embodiment of the present invention.

The process starts by receiving a mask layout (step 402).

Next, the system chooses a shifter, such as shifter 450, in the mask layout for correction (step 404).

The system then iteratively modifies the shifter by first choosing a region within the shifter (step 406). In one embodiment of the present invention, the system chooses a region, such as region 452, along the border of the shifter. Specifically, in one embodiment of the present invention, the system chooses a region such that the distance between the inner edge of the chosen region and the perimeter of the shifter is greater than or equal to a fixed distance.

Next, the system adjusts the phase shift of the chosen region in a simulation model (step 408). Note that the adjusted phase shift accounts for various 3D effects, such as the imperfect 3D structure of the shifter. For example, the system may adjust the phase shift of chosen region 452. Furthermore, in one embodiment of the present invention, the actual value of the phase shift adjustment can be found empirically and then used in the simulation.

The system then uses a simulation model to generate an aerial image (or simulated pattern). Note that the simulation model generates the simulated pattern using the shifter which contains the region with the adjusted phase.

Next, the system modifies the shape of the shifter based on the difference between a desired pattern and the simulated pattern that was generated using the simulation model (step 410). In one embodiment of the present invention, the system may decide to modify the shifter by adding artifacts, such as serifs or hammerheads. For example, the system can modify shifter 450 by adding serif 454. Furthermore, in one embodiment of the present invention, the system can also modify the shape of the phase-adjusted region. Additionally, in one embodiment of the present invention, the system can simultaneously modify the shape of all the shifters in the mask based on the difference between a desired pattern and the simulated pattern that was generated using the simulation model.

The system then determines whether to terminate the iteration (step 412). It will be apparent to one skilled in the art that the system can determine to terminate the iteration based on a variety of factors. For example, in one embodiment of the present invention, the system can terminate the iteration if the difference between the desired pattern and the simulated pattern becomes too small. Moreover, the system can also decide to terminate the iterative loop if a maximum number of iterations have been reached.

The process ends if the system decides to terminate the iteration. The resulting shape of the shifter is then used on the actual mask during lithography.

If the system does not decide to terminate the iteration, the system goes back to step 406 and chooses a region within the modified shifter. For example, the system can choose region 456 within the modified shifter.

It will be apparent to one skilled in the art that the system can choose a different region in each iteration. Furthermore, the system can use a different phase shift adjustment in each iteration. Moreover, in one embodiment of the present invention, the corrected shifter 490 can have multiple regions each with a different phase shift. For example, corrected shifter 490 can have a region with a "A" phase shift 492, a region with a "B" phase shift 494, and a region with a 180° phase shift 496. Note that the actual value of "A" and "B" can be found empirically and then used in the simulation. (Recall that these adjustments to the phase shifts are performed in the simulation model. They are not performed on the actual mask.)

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art.

For example, it will be readily apparent to one skilled in the art that the present invention can either be implemented separately or as an extension to an OPC process. Specifically, in one embodiment of the present invention, an aerial image intensity model which is used in an OPC process can be enhanced to account for imperfections in the 3D structure of the shifter by allowing the image intensity model to choose a region within a shifter and change its phase shift.

Additionally, the above disclosure is not intended to limit the present invention. The scope of the present invention is defined by the appended claims.

What is claimed is:

1. A method for improving lithography performance by correcting for 3D mask effects, the method comprising:
   receiving a mask layout that contains etched regions, called shifters, that can have a phase shift relative to other regions;
   choosing a shifter in the mask layout;
   correcting for 3D mask effects by, iteratively,
      selecting a region within the shifter,
      adjusting the phase shift of the selected region in a simulation model to account for 3D mask effects,
      performing a simulation to generate a simulated pattern based on a simulation model,
      modifying the shape of the shifter based on the difference between a desired pattern and the simulated pattern, and
      determining whether to terminate the iteration.

2. The method of claim 1, wherein the method is performed during an optical proximity correction process.

3. The method of claim 1, wherein the mask can be an alternating PSM or an alternating aperture PSM.

4. The method of claim 1, wherein the phase shift of a shifter can be 0°, 90°, 180°, 270°, or any other combination of phase shifts that offsets the phase shifts of adjacent shifters by 180°.

5. The method of claim 1, wherein selecting the region within the shifter involves selecting a region along the border of the shifter.

6. The method of claim 1, wherein modifying the shape of the shifter can involve adding hammerheads or serifs to the shifter.

7. The method of claim 1, wherein adjusting the phase shift of the selected region in the simulation model involves assigning a phase shift to the selected region which is less than a desired phase shift value.

8. A computer-readable storage medium storing instructions that when executed by a computer cause the computer to perform a method for improving lithography performance by correcting for 3D mask effects, the method comprising:
   receiving a mask layout that contains etched regions, called shifters, that can have a phase shift relative to other regions;
   choosing a shifter in the mask layout;
   correcting for 3D mask effects by, iteratively,
      selecting a region within the shifter,
      adjusting the phase shift of the selected region in a simulation model to account for 3D mask effects,
      performing a simulation to generate a simulated pattern based on a simulation model,
      modifying the shape of the shifter based on the difference between a desired pattern and the simulated pattern, and
      determining whether to terminate the iteration.

9. The computer-readable storage medium of claim 8, wherein the method is performed during an optical proximity correction process.

10. The computer-readable storage medium of claim 8, wherein the mask can be an alternating PSM or an alternating aperture PSM.

11. The computer-readable storage medium of claim 8, wherein the phase shift of a shifter can be 0°, 90°, 180°, 270°, or any other combination of phase shifts that offsets the phase shifts of adjacent shifters by 180°.

12. The computer-readable storage medium of claim 8, wherein selecting the region within the shifter involves selecting a region along the border of the shifter.

13. The computer-readable storage medium of claim 8, wherein modifying the shape of the shifter can involve adding hammerheads or serifs to the shifter.

14. The computer-readable storage medium of claim 8, wherein adjusting the phase shift of the selected region in the simulation model involves assigning a phase shift to the selected region which is less than a desired phase shift value.

15. An apparatus for improving lithography performance by correcting for 3D mask effects, the apparatus comprising:
   a receiving mechanism configured to receive a mask layout that contains etched regions, called shifters, that can have a phase shift relative to other regions;
   a choosing mechanism configured to choose a shifter in the mask layout;
   a correcting mechanism configured to correct for 3D mask effects by, iteratively,
      selecting a region within the shifter,
      adjusting the phase shift of the selected region in a simulation model to account for 3D mask effects,
      performing a simulation to generate a simulated pattern based on a simulation model,
      modifying the shape of the shifter based on the difference between a desired pattern and the simulated pattern, and
      determining whether to terminate the iteration.

16. The apparatus of claim 15, wherein the apparatus is configured to operate during an optical proximity correction process.

17. The apparatus of claim 15, wherein the PSM can be an alternating PSM or an alternating aperture PSM.

18. The apparatus of claim 15, wherein the phase shift of a shifter can be 0°, 90°, 180°, 270°, or any other combination of phase shifts that offsets the phase shifts of adjacent shifters by 180°.

19. The apparatus of claim 15, wherein the correcting mechanism is configured to select a region along the border of the shifter.

20. The apparatus of claim 15, wherein the correcting mechanism is configured to add hammerheads or serifs to the shifter.

21. The apparatus of claim 15, wherein the correcting mechanism is configured to assign a phase shift to the selected region which is less than a desired phase shift value.

* * * * *